(12) United States Patent
Kasanyal

(10) Patent No.: US 8,698,559 B2
(45) Date of Patent: Apr. 15, 2014

(54) AMPLIFIER CIRCUIT AND METHOD

(75) Inventor: Sunil Kasanyal, Pithoragarh (IN)

(73) Assignee: NXP B.V., Eindhoven (NL)

( * ) Notice: Subject to any disclaimer, the term of this patent is extended or adjusted under 35 U.S.C. 154(b) by 50 days.

(21) Appl. No.: 13/402,907

(22) Filed: Feb. 23, 2012

(65) Prior Publication Data

US 2012/0229214 A1 Sep. 13, 2012

(30) Foreign Application Priority Data

Mar. 7, 2011 (EP) .................................... 11157160

(51) Int. Cl.
*H03F 3/45* (2006.01)
(52) U.S. Cl.
USPC .......................................... 330/253; 330/258
(58) Field of Classification Search
USPC .................................................. 330/252–261
See application file for complete search history.

(56) References Cited

U.S. PATENT DOCUMENTS

| 6,930,530 | B1 | 8/2005 | Wang |
| 6,956,436 | B2 | 10/2005 | Li et al. |
| 7,119,600 | B2 | 10/2006 | Chen |
| 2006/0214692 | A1 | 9/2006 | Moon |

OTHER PUBLICATIONS

Boni, Andrea, et al. "LVDS I/O Interface for Gb/s-per-Pin Operation in 0.35-μm CMOS"; IEEE J. of Solid-State Circuits, vol. 36, No. 4, pp. 706-711 (Apr. 2001).
Kumric, Marijan, et al.; "Digitally Tuneable On-Chip Line Termination Resistor for 2.5Gbit/s LVDS Receiver in 0.25 μ Standard CMOS Technology," IEEE SS Circuits Conf, European Villach, Austria pp. 241-244 (Sep. 2001).
Extended European Search Report for European patent appln. No. 11157160.0 (Aug. 24, 2011).

*Primary Examiner* — Hieu Nguyen

(57) ABSTRACT

A differential amplifier circuit comprises a differential pre-amplifying stage which is designed to allow an input signal with a first common mode voltage range, and to generate an output which has a narrower common mode voltage variation. This pre-amplifier stage is designed to accept a large common mode input voltage and to process the signal so that it can be amplified by a main amplifying stage which is designed to allow an input signal with a smaller common mode voltage range.

14 Claims, 4 Drawing Sheets

AMPLIFIER CIRCUIT AND METHOD

CROSS-REFERENCE TO RELATED APPLICATIONS

This application claims the priority under 35 U.S.C. §119 of European patent application no. 11157160.0, filed on Mar. 7, 2011, the contents of which are incorporated by reference herein.

The present invention relates generally to amplifier circuits, and particularly to high-speed receiver circuits. In particular, the invention relates to the high-speed low voltage differential signalling receiver circuits, with wide common mode range and suitable for dual supply voltage integrated circuits.

Differential signalling has been utilized for many years as a data transmission method. Differential drivers and receivers are used in many input/output (I/O) applications such as in communications circuits, video circuits and other integrated circuits that demand high data transfer rate. Differential drivers and receivers are for example used in integrated circuits (IC) for on-chip communication between circuits, chip-to-board, off-chip communications, etc.

A differential receiver converts and amplifies a differential input signal to a differential output signal or single-ended output signal which is then provided to the semiconductor core. These receivers offer high data transmission speeds, low noise coupling, and low EMI (electromagnetic interference).

In conventional I/O designs, a large volume of data at high speed is achieved by using a large degree of parallelism. These parallel I/O structures occupy more and more space on the IC and circuit board. This complicates the design of the circuits because there is less space available on the chip, and increases the cost of such ICs due to an increased die size.

The low voltage differential signalling (LVDS) interface reduces the voltage swing and can operate at very high speed with reduced power consumption. By virtue of the high speed operation capability, large data volumes can be transferred as serial data, thereby reducing the degree of parallelism and hence reducing the IC size and complexity.

High speed differential receiver circuits require a large common mode range to accommodate the common mode noise and ground potential shift from the transmitting IC to the receiving IC. The common mode range of the receiver depends on the application. For example, for cable interfacing when the transmitter and the receiver are placed on different PCBs, the ability to tolerate rail-to-rail common mode voltage levels is recommended to accommodate the large ground potential shift between two boards. In many applications, where the transmitting and receiving circuits are on the same board, the rail-to-rail common mode range is not necessary, but still a wide common mode range is required to accommodate any ground potential shift and common mode noise.

Such specifications are specified in IEEE Std 1596.3-1996 for the LVDS standard for a reduced range link. This defines the voltage range from 825 mV to 1575 mV. There are many other differential signalling standards defined such as HDMI, DisplayPort, HSTL, SSTL, etc. Similar receiver schemes can be used for any differential signalling standard based on the required common mode range. If the supported common mode range is high, a receiver architecture can be used to support various standards which can save design effort and increase the re-usability.

To support a wide common mode range and to increase the compatibility with available transmitter ICs, the supply voltage of a receiver needs to be kept high (for example 2.5V or 3.3V) whereas to meet the high-speed, high density and lower die size for cost efficiency, the core circuitry is implemented at low supply voltages (for example for 65 nm technology the core voltage is kept at around 1.0V). Such dual voltage ICs create the requirement of receiver circuitry which can operate at very high speed and support wide common mode input range, as well as giving an output signal at the core voltage with minimum distortion.

FIG. 1 shows a prior art receiver circuit as described in U.S. Pat. No. 6,930,530. This receiver circuit is used for dual supply voltage ICs.

This circuit has a first stage 10 in the form of a differential amplifier operating at an I/O supply voltage vddio (short for "I/O voltage $V_{DD}$").

The amplifier comprises two branches with PMOS input transistors, which sink the current from a current source IS2. The current source IS2 of the differential amplifier 10 is controlled by biasing circuitry 12 using the lower core supply voltage vddc.

The current is controlled in such a way that the output common mode voltage of first stage amplifier is vddc/2. The output of first stage is further amplified (by AMP2) to obtain the desired output swing from 0V to vddc.

This receiver circuit has two main disadvantages. The input common mode voltage of this receiver circuit is limited, and also the receiver circuit cannot support the common mode range near to the higher supply voltage vddio.

The highest value of common mode voltage is limited by the PMOS transistor implementing current source IS2.

It can be shown that the highest common mode voltage is given by:

$$V_{CM}(\max) = vddio - (Vtp(MP1) + V_{OD}(IS2) + V_{OD}(MP1)) \quad (1)$$

This derives from three equations:
$VCR1 = vddio - Vtp(IS2) - V_{OD}(IS2)$ which defines the condition for the current source to sink the required current;
$V_{N1}(\max) = VCR1 + Vtp(IS2)$ which defines saturation of the transistor implementing IS2: and
$V_{CM}(\max) = V_{N1} - Vtp(MP1) - V_{OD}(MP1)$ which defines the condition for transistor MP1 to be in saturation.

In these equations, Vtp(MP1) is the threshold voltage of PMOS MP1, $V_{OD}(IS2)$ is the overdrive voltage of the PMOS transistor of the current source IS2 and $V_{OD}(MP1)$ is the overdrive voltage of the input PMOS transistor MP1, $V_{N1}$ is the voltage of node N1, Vtp(IS2) is the threshold voltage of the PMOS transistor of the current source IS2.

For example, if an overdrive voltage of PMOS transistors IS2 and MP1 is 100 mV and the threshold voltage of PMOS MP1 is 400 mV, then upper limit of common mode voltage would be vddio−600 mV.

The lowest value of common mode voltage is limited by the PMOS MP1. To keep MP1 in saturation:

$$V_{INP} > vddc/2 - Vtp(MP1) \quad (2)$$

So, the lower common mode voltage is given by:

$$V_{CM}(\min) = vddc/2 - Vtp(MP1) \quad (3)$$

For example, if vddc is 1.2V and the threshold voltage of MP1 is 400 mV, then the lower common mode voltage would be 200 mV. To keep some margin around the common mode voltage, the lower common mode voltage would be limited to around 300 mV.

This shows that the common mode voltage of the receiver is limited, in particular by the transistors in the current source IS2 that are in series with the high voltage rail and the transistor MP1 which is in series with the low voltage rail.

There is therefore a need for a receiver circuit which provides high-speed operation for a wide input common mode range, for example for dual supply voltage integrated circuits.

According to the invention, there is provided a differential amplifier circuit, comprising:

a differential pre-amplifying stage which is designed to allow an input signal with a first common mode voltage range, and to generate an output which has a narrower common mode voltage variation;

a main differential amplifying stage which is designed to allow an input signal with a second common mode voltage range smaller than the first common mode voltage range, wherein the output of the pre-amplifying stage has a smaller common mode voltage variation than the second common mode voltage range.

The amplifier circuit of the invention can be used as a high speed receiver circuit having a wide common mode voltage range. The output can be designed to have a lower voltage swing than the common mode voltage range at the input. The output can be designed for compatibility with a core supply voltage.

The pre-amplifying stage senses the input differential voltage, irrespective of its common mode voltage within the permitted range, and preferably converts this differential voltage into a differential current. This differential current is then converted into output differential voltage.

Since the differential current is generated by sensing the input voltage difference only, its value can remain the same for any input common mode voltage within the defined common mode range. This gives the smaller common mode voltage swing at the output of the pre-amplifying stage. The pre-amplifying stage can even have have constant common mode voltage. In this way, the pre-amplifying stage can convert a wide common mode differential signal into a constant common mode differential voltage signal.

The output of the pre-amplifying stage is further amplified by the main amplifying stage. The final output of the main amplifying stage can have a voltage swing from ground to a core supply voltage which is lower than the voltage supply to the pre-amplifying stage, which can instead be designed for a higher I/O voltage range.

The pre-amplifying stage can comprise two branches between a high voltage rail and a sink current source, each branch comprising, in series, a top current source connected to the high voltage rail and an NMOS input transistor connected to the sink current source.

The top current sources can each comprise a PMOS transistor and the sink current source can comprise an NMOS transistor.

In this way, the pre-amplifying stage is implemented as an NMOS type differential amplifier with current source loads. This architecture provides the wide common mode range towards the upper supply voltage. The pre-amplifying stage preferably operates at a high I/O supply voltage.

The main amplifying stage can comprises two branches between a supply current source and ground, the supply current source connected to the high voltage rail, each branch comprising, in series, a main amplifying stage input transistor connected to the supply current source and a resistor connected to ground.

A bias current generating circuit can be used to generate a control signal for controlling the supply current source of the main amplifying stage.

The supply current sources can comprise PMOS transistors and each main amplifying stage input transistor can comprises a PMOS transistor.

The main amplifier stage is in this way implemented as PMOS type differential amplifier with a resistive load. The bias current for the main amplifier stage can be controlled by the (lower) core supply voltage and the load resistors are chosen such that the main amplifier stage gives an output common mode voltage as half of the core supply voltage. This means that the output of the amplifying stage swings about half of the core supply voltage and its swing is from ground to core supply voltage. Thus, the final output signal of the receiver will be available at core supply voltage.

A second main amplifying stage may be provided to generate the desired voltage swing if this is not already available from the output of the (first) main amplifying stage.

As outlined above, the pre-amplifying stage is preferably powered by a larger first (I/O voltage) voltage range and the circuit output is adapted to be within a smaller second (core voltage) voltage range The I/O voltage may have a maximum voltage range greater than 2.0V, for example 2.5V or more, whereas the core voltage may have a maximum voltage range less than 2.0V, for example 1.5V or less.

The invention also provides a method of amplifying a differential input signal, comprising:

performing a differential pre-amplification to an input signal with a first permitted common mode voltage range, to generate an output which has a narrower common mode voltage variation;

performing a main differential amplification to an input signal with a permitted second common mode voltage range smaller than the first common mode voltage range, wherein the output of the pre-amplification has a smaller common mode voltage variation than the permitted second common mode voltage range.

Examples of the invention will now be described in detail with reference to the accompanying drawings, in which.

The invention provides a differential amplifier circuit, comprising a differential pre-amplifying stage which is designed to allow an input signal with a first (large) common mode voltage range, and to generate an output which has a narrower common mode voltage variation, or even a constant common mode output voltage. This pre-amplifier stage is designed to accept a large common mode input voltage and to process the signal so that it can be amplified by a main amplifying stage which only needs to be designed to allow an input signal with a smaller common mode voltage range.

Figure 2:
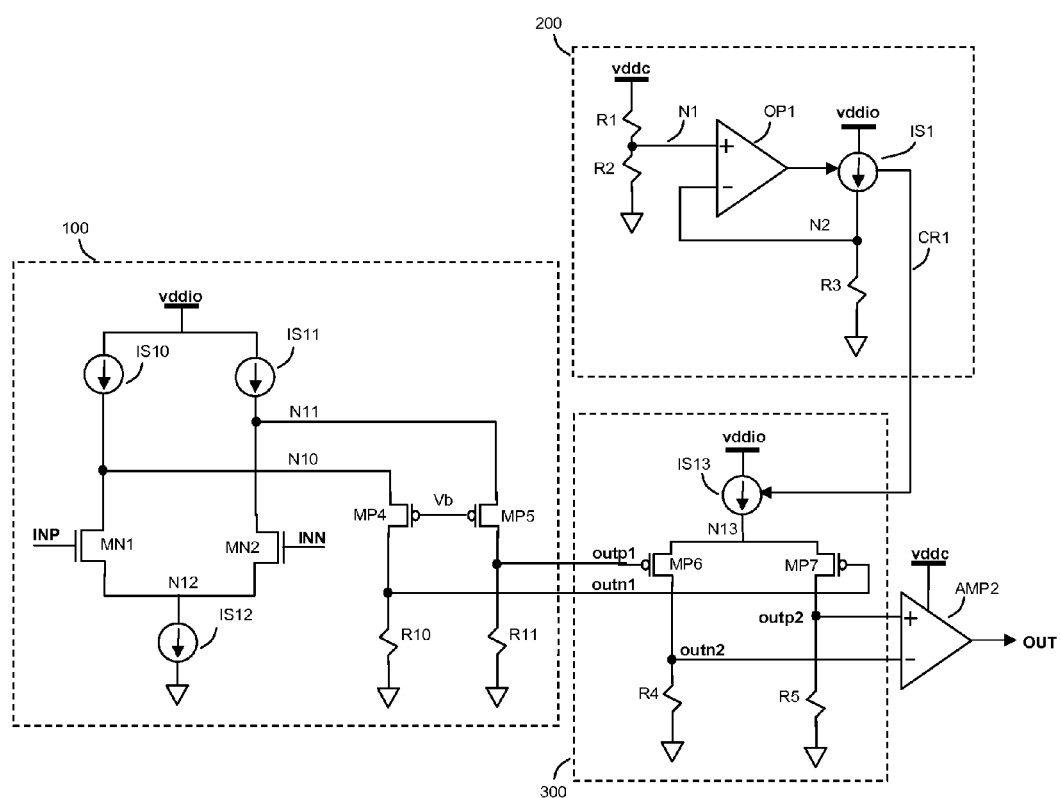
FIG. 2 shows an example of the high-speed, wide common mode range receiver circuitry according to the present invention.

FIG. 2 shows an example of circuit diagram of the one example of high-speed, wide common mode range differential amplifier (receiver) for dual voltage integrated circuits. This example of receiver circuit can be broadly divided into four parts. The first part is the pre-amplifying stage 100, the second part is the first amplifying stage 300, the third part is the (optional) second amplifying stage AMP2 and the fourth part is the bias current generating circuit 200. The bias current generating circuit is essentially the same as in the prior art, and other bias control circuits can be used.

The pre-amplifying stage consists of a current sink IS12 connected between a ground terminal and an internal node N12. This current sink IS12 can be implemented by using an NMOS transistor in the saturation region with its gate voltage controlled by a bias voltage.

MN1 is the first input transistor connected between the node N12 and a node N10. The gate of NMOS transistor MN1 is controlled by the positive input terminal INP. MN2 is the second input transistor connected between node N12 and a node N11. The gate of MN2 is controlled by the negative input terminal INN.

The sizes of the NMOS transistors MN1 and MN2 should be the same and the layout of these transistors should be symmetrical to minimize the offset due to asymmetry.

The pre-amplifying stage 100 has two current sources IS10 and IS11 at the top. Current source IS10 is connected between the I/O supply voltage vddio and the node N10. Current source IS11 is connected between I/O supply voltage vddio and the node N11. These two current IS10 and IS11 can be implemented by using same size PMOS transistors in saturation with their gate voltage controlled by the same bias voltage.

The layout of the PMOS transistors implementing current sources IS10 and IS11 should also be as symmetrical as possible to avoid any mismatch in current which will cause the asymmetrical voltage at the output nodes outp1 and outn1.

PMOS transistors MP4 and MP5 act as switches to steer current to termination resistors R10 and R11 based on the voltage difference at input nodes INP and INN.

MP4 has its source connected to node N10 and its drain connected to the negative output outn1 of the pre-amplifying stage 100. MP5 has its source connected to node N11 and its drain connected to the positive output outp1 of the pre-amplifying stage 100.

The gate of MP4 and MP5 is controlled by a bias voltage Vb. Resistor R10 and R11 are termination resistors which are used to convert the current into voltage. Resistor R10 is connected between the ground terminal and the output node outn1 and the resistor R11 is connected between the ground terminal and the output node outp1.

The pre-amplifying stage is thus essentially a two-branch differential amplifier with a current output to two output branches, and with a current to voltage converter at each of the output branches. The branches uses NMOS input transistors so that the common mode voltage can be raised.

The first amplifying stage 300 has a top current source IS13 connected between the higher I/O supply voltage vddio and a node N13. Current through this current source is controlled by a current bias signal CR1 generated by the bias generating circuit 200.

To reduce the current consumption, the current of IS13 is preferably a multiple of the current of current source IS1 in the bias generating circuit. For example, the current flowing through IS13 can be 10 times of the current flowing into current source IS1.

The current sources IS13 and IS1 can each be implemented by using a PMOS transistor with its gate controlled by a bias voltage CR1. The width of the PMOS of current source IS13 will be a multiple of the width of the PMOS of current source IS1 based on the current multiplication provided.

For example, if the current of current source IS13 is 10 times that of the current of IS1, then the width of the PMOS transistor of IS13 will be 10 times of the width of the PMOS transistor of IS1.

The first stage amplifier circuit 300 has two input PMOS transistors MP6 and MP7. PMOS transistor MP6 has its source connected to node N13 and the drain is connected to a first differential output node outn2. The gate of PMOS transistor MP6 is connected to the output node outp1 which is the positive output node of the pre-amplifying stage 100. The second input PMOS transistor MP7 of the first stage amplifier 300 has its source connected to node N13 and its drain connected to a second differential output node outp2.

The gate of PMOS transistor MP7 is connected to the node outn1 which is the negative output node of pre-amplifying stage 100.

The first stage amplifier 300 has two bottom resistors R4 and R5. Resistor R4 is connected between the ground terminal and the first differential output outn2 and resistor R5 is connected between the ground terminal and the second differential output outp2.

Figure 1:
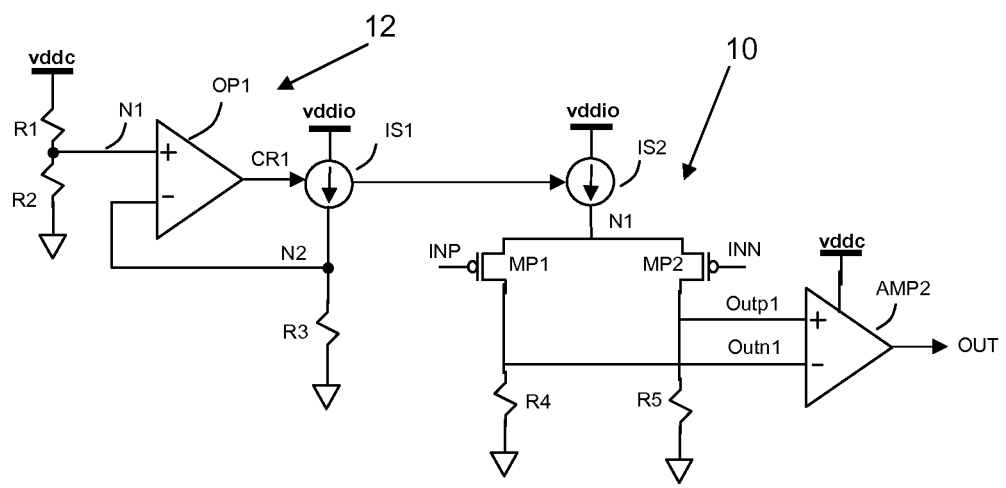
FIG. 1 shows an example of known receiver circuitry.

The bias generating stage 100 functions in the same way as in the prior art circuit of FIG. 1.

In particular, a voltage divider is generated by two resisters R1 and R2. Resistor R1 is connected between the (lower) core supply voltage vddc and node N1 and resistor R2 is connected between node N1 and the ground terminal. This voltage divider generates the voltage at the node N1.

For design simplicity, resistors R1 and R2 are of same value, so the voltage at node N1 will be the half of the core supply voltage vddc. The bias current generating circuit 200 has one op-amp OP1. The positive terminal of OP1 is connected to node N1 and the negative terminal is connected to feedback node N2. The output of OP1 generates a reference current bias voltage CR1.

This voltage CR1 controls the current through current source IS1 which can be implemented by using a PMOS transistor. Resistor R3 is connected between the ground terminal and the node N2.

The second stage amplifier AMP2 (also present in the circuit of FIG. 1) is used to further amplify the differential output signals outp2 and outn2, which are output from the first stage amplifying stage 300. This amplifying stage AMP2 can be similar to the first stage amplifying stage 300 with the supply voltage as the higher I/O supply voltage vddio or it can be implemented by using inverters operating at the lower core supply voltage vddc. The output OUT of this stage is the final output of the receiver circuit, and is at the core supply voltage vddc.

Figure 3:
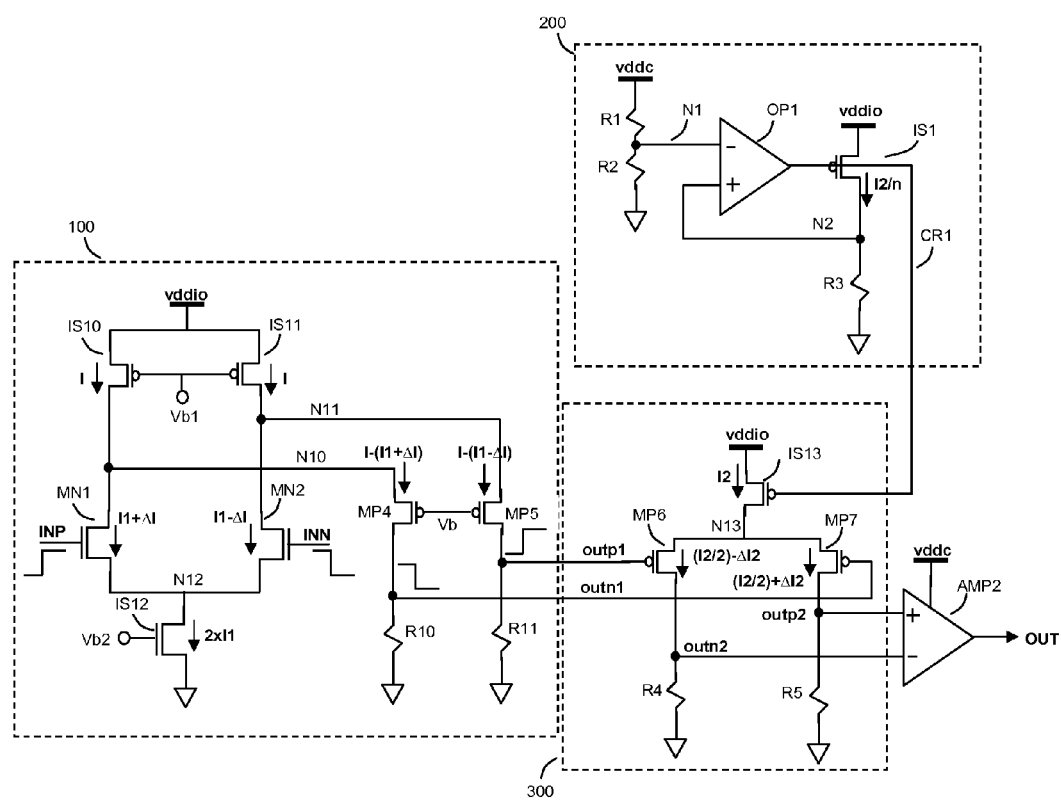
FIG. 3 shows the current in various branches of the receiver circuitry when a differential voltage is applied at inputs.

The advantages of the circuit of FIG. 2 will be explained using FIG. 3, which shows the receiver circuitry of FIG. 2 with the current values shown. Also in FIG. 3, all current sources and current sinks are shown as implemented by using MOS transistors.

The input common mode range which can be supported by the receiver will first be demonstrated.

The lower common mode voltage of the receiver is restricted by the over drive voltages in NMOS transistors IS12 and MN1 (or MN2) and the threshold voltage of NMOS transistor MN1.

The bias voltage of IS12 is:

$$Vb2 = Vtn(IS12) + V_{OD}(IS12) \quad (1)$$

Where Vtn(IS12) is the threshold voltage of NMOS transistor IS12 and $V_{OD}$(IS12) is the overdrive required by IS12 to sink the required current.

To keep IS12 in saturation, the minimum voltage at node N12 is:

$$VN12 = [Vb2 - Vtn(IS12)] \quad (2)$$

To switch on NMOS transistor MN1 (or MN2):

$$V_{GS}(MN1) = V(INP) - V(N12) = V(INP) - [Vb2 - Vtn(IS12)] = Vtn(MN1) + V_{OD}(MN1) \quad (3)$$

Where Vtn(MN1) is the threshold voltage of NMOS MN1 and $V_{OD}$(MN1) is the required overdrive required for MN1.

This gives:

$$V(INP) = V_{OD}(IS12) + V_{OD}(MN1) + Vtn(MN1) \quad (4)$$

The minimum value of V(INP) or V(INN) represents the minimum value of common mode voltage. Thus:

$$VCM(\min) = VINP(\min) = VINN(\min) = V_{OD}(IS12) + V_{OD}(MN1) + Vtn(MN1) \quad (5)$$

For example, if the required overdrive voltage for the transistor of IS12 and transistor MN1 is 100 mV and the threshold voltage of transistor MN1 is 400 mV, then the minimum common mode voltage would be 600 mV.

The upper value of the common mode voltage is restricted by the top PMOS current sources IS10 and IS11 and the input NMOS transistors MN1 and MN2.

To bias the PMOS transistor IS10 to provide the required current:

$$Vb1 = vddio - Vtp(IS10) - V_{OD}(IS10) \quad (6)$$

Where Vtp(IS10) is the absolute value of threshold of the PMOS transistor of IS10 and $V_{OD}$(IS10) is the overdrive voltage of the PMOS transistor of IS10.

Since the PMOS transistors IS10 and IS11 are similar and the same size, the threshold voltage and required overdrive for both PMOS transistors will be the same.

The minimum voltage at node N10 (or N11) to keep IS10 (or IS11) in saturation is:

$$V(N10) = Vb1 + Vtp(IS10) = vddio - V_{OD}(IS10) \quad (7)$$

To keep NMOS transistor MN1 (or MN2) in saturation, the maximum voltage at node N10 is:

$$VN10 > V(INP) - Vtn(MN1) \quad (8)$$

So, the maximum voltage at INP is $$V(INP) = vddio - V_{OD}(IS10) + Vtn(MN1) \quad (9)$$

This would be the maximum value of common mode voltage. Thus:

$$VCM(\max) = vddio - V_{OD}(IS10) + Vtn(MN1) \quad (10)$$

For example, for an overdrive voltage of the transistor of IS10 of 200 mV and threshold voltage of NMOS MN1 of 400 mV, the maximum common mode voltage would be vddio+200 mV.

The above analysis shows that the pre-amplifying stage supports the required wide common mode range.

In particular, the higher common mode voltage is increased by having an NMOS input transistor, so that the gate-drain junction is between the input and the high voltage rail, rather than the gate-source junction. Thus, the pre-amplifying stage comprises two branches between a high voltage rail and a sink current source IS12, each branch comprising, in series, a top current source connected to the high voltage rail and an NMOS input transistor connected to the sink current source. The top current source is implemented as a PMOS transistor and the sink current source IS12 is implemented as an NMOS transistor.

The pre-amplifier stage is essentially designed to allow an input signal with a large common mode voltage range, and translate this into an output signal which has a narrower common mode voltage variation. This is achieved by defining an output voltage by a differential current-to-differential voltage conversion. This provides an output which is insensitive to common mode voltage variations at the input. The narrower common mode voltage variation at the output can in fact be zero or close to zero. The output signal can in this way be considered to have the common mode variations suppressed.

This means that the output from the pre-amplifier stage can be fed to an amplifier with smaller permitted common mode voltage range.

Thus, the pre-amplifier stage can tolerate an input signal with a larger common mode voltage range than can be tolerated by the main amplifier stage 300, and generates an output with a smaller common mode voltage range than the common mode voltage range that can be tolerated by the main amplifier stage.

The circuit functionality in common mode is now explained. The assumed value of currents in each branch is shown in FIG. 3.

Assuming current sources IS10 and IS11 each are providing current I:
Current through IS10=current through IS11=I
Assuming the current through current sink IS12=2×I1.
In the common mode, when the voltage at INP and INN are same:
Current through MN1=Current through MN2=I1.
Current through MP4=current through MP5=(I−I1)
Assume, R10=R11=R
Then, the voltage at outp1 and outn1 is given by:

$$Voutp1 = Voutn1 = (I - I1)*R \quad (11)$$

In the reference current generating circuitry 200, it is assumed that the current flowing through IS1=I2/n (to give a current in IS13 of I2 as seem below)
The voltage at node N2=vddc/2, so the value of R3 is:

$$R3 = (n*vddc)/(2*I2) = n*Rref \text{ (with } Rref = vddc/2*I2)$$

Since the current in the current source IS1 is mirrored in the current source IS13 with a multiplication factor of 'n', the current through IS13=I2.

To make the common mode voltage at outp2 and outn2 equal to vddc/2, the value of resistance of R4 and R5 should be 2/n times of the value of resistance R3.
So, R4=R5=2*Rref.

When outp1 and outn1 are same, the current flowing through MP6 and MP7=I2/2. The voltage at outp2 and outn2 is given by:

$$Voutp2 = Voutn2 = I2*Rref = vddc/2 \quad (12)$$

So, the common mode voltage available at outp2 and outn2 will be vddc/2.

The receiver circuit function is now explained for a differential input. FIG. 3 also shows the differential current which flow. When INP goes higher then INN, it generates a differential current ΔI.

$$\Delta Vin = VINP - VINN \quad (13)$$

Current through MN1=I1+ΔI
Current through MN2=I1−ΔI
Current through MP4=current through R10=I−(I1+ΔI)
Current through MP5=current through R11=I−(I1−ΔI)
The Voltage at outp1 is given by:

$$Voutp1 = [I - (I1 - \Delta I)]*R \quad (14)$$

The voltage at outn1 is given by:

$$Voutn1 = [I - (I1 + \Delta I)]*R \quad (15)$$

Since I−(I1−ΔI)>I−(I1+ΔI), it follows that Voutp1>Voutn1
So, when INP becomes positive then INN, outp1 becomes positive with respect to outn1.

$$\Delta Vout1 = Voutp1 - Voutn1 = 2*\Delta I*R \quad (16)$$

The gain of first stage is given by:

$$Av1 = (\Delta Vout1)/(\Delta Vin) \quad (17)$$

This voltage difference between outp1 and outn1 creates the difference in current between MP4 and MP5. Naming this difference as ΔI2, the current in MP6 is given by:

$$IMP6 = (I2/2) - \Delta I2$$

And, the current in MP7 is given by:

$$IMP7 = (I2/2) + \Delta I2$$

The voltage at outp2 is given by:

$$Voutp2 = [(I2/2) + \Delta I2]*2Rref \quad (18)$$

The voltage at outn2 is given by:

$$Voutn2=[(I2/2)-\Delta I2]*2Rref \quad (19)$$

Since $[(I2/2)+\Delta I2]>[I(I2/2)-\Delta I2]$, this gives $$Voutp2 > Voutn2 \quad (20)$$

So, when INP becomes positive then INN, outp2 becomes positive with respect to outn2.

$$\Delta Vout2 = Voutp2 - Voutn2 = 4*\Delta I2*Rref \quad (21)$$

This voltage difference of ΔVout2 is fed to the second amplifying stage. If the voltage swing at outp2 and outn2 is from 0V to vddc, then outp2 and outn2 can be fed to inverters which are used to form the amplifier AMP2. If the gain multiplication of pre-amplifying stage 100 and first amplifying 200 is not sufficient to generate the desired voltage swing of 0V to vddc at outp2 and outn2, then one more stage of amplification similar to stage 200 can be used as the amplifier AMP2. The final output OUT of the receiver will have a swing from 0V to vddc.

Figure 4:
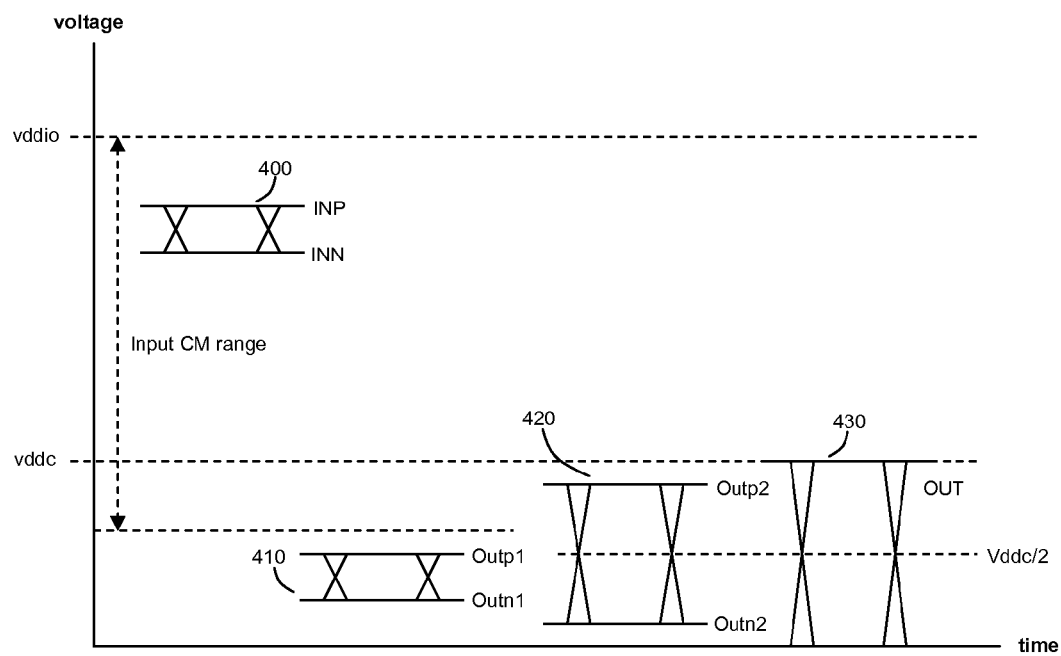
FIG. 4 presents a graphical representation of the relationship between the input common mode voltage and the output common mode voltage according to the present invention.

FIG. 4 presents graphically the relationship between the input common mode voltage and the output common mode voltage according to the present invention.

The input signal 400 can be anywhere in the range of the input common mode range shown in the diagram. Signal 410 is the signal at outp1 and outn1. The common mode voltage of this signal will be approximately fixed at the value as defined in above description.

Waveform 420 shows the signal at outp2 and outn2. The common mode voltage of this signal will be at vddc/2. The swing of this signal may be from 0V to vddc or it may be less depending on the gain provided by pre-amplifying stage 100 and first amplifying stage 300.

Waveform 430 shows the final output signal OUT. This signal also has common mode voltage at vddc/2 and swing of this signal will be from 0V to vddc.

The invention can be used to implement any kind of differential receiver interface which has wide common mode range. Examples of such differential interfaces are LVDS, HDMI, DisplayPort, PCI-Xpress, USB 2.0, JEDEC 204A, DDR (HSTL/SSTL).

Various modifications will be apparent to those skilled in the art.

The invention claimed is:

1. A differential amplifier circuit, comprising:
   a differential pre-amplifying stage which is designed to allow an input signal with a first common mode voltage range, and to generate an output which has a narrower common mode voltage variation; and
   a main differential amplifier stage which is designed to allow an input signal with a second common mode voltage range smaller than the first common mode voltage range,
   wherein the output of the pre-amplifying stage has a smaller common mode voltage variation than the second common mode voltage range; and
   wherein the main amplifying stage comprises two branches between a supply current source and ground, the supply current source connected to the high voltage rail, each branch comprising, in series, a main amplifying stage input transistor connected to the supply current source and a resistor connected to ground.

2. A circuit as claimed in claim 1, wherein the differential pre-amplifying stage generates a differential current output and comprises a differential current to differential voltage conversion circuit.

3. A circuit as claimed in claim 1, wherein the pre-amplifying stage comprises two branches between a high voltage rail and a sink current source, each branch comprising, in series, a top current source connected to the high voltage rail and an NMOS input transistor connected to the sink current source.

4. A circuit as claimed in claim 3, wherein the top current sources each comprise a PMOS transistor.

5. A circuit as claimed in claim 4, wherein the sink current source comprises an NMOS transistor.

6. circuit as claimed in claim 1, further comprising a bias current generating circuit.

7. A circuit as claimed in claim 6, wherein the bias current generating circuit is used to generate a control signal for controlling the supply current source.

8. A circuit as claimed in claim 1, wherein the supply current sources comprises a PMOS transistor.

9. A circuit as claimed in claim 8, wherein each main amplifying stage input transistor comprises a PMOS transistor.

10. A circuit as claimed in claim 1, wherein the pre-amplifying stage is powered by a first voltage range and the circuit output is adapted to be within a smaller second voltage range.

11. A differential amplifier circuit, comprising:
    a differential pre-amplifying stage which is designed to allow an input signal with a first common mode voltage range, and to generate an output which has a narrower common mode voltage variation; and
    a main differential amplifying stage which is designed to allow an input signal with a second common mode voltage range smaller than the first common mode voltage range,
    wherein the output of the pre-amplifying stage has a smaller common mode voltage variation than the second common mode voltage range; and
    a second main amplifying stage.

12. A circuit as claimed in claim 11, wherein the second main amplifying stage is powered by the second voltage range, and the first and second voltage ranges together comprise a pair of dual supply voltages of a dual voltage integrated circuit.

13. A method of amplifying a differential input signal, comprising:
    performing a differential pre-amplification to an input signal with a first permitted common mode voltage range, to generate an output which has a narrower common mode voltage variation; and
    performing a main differential amplification to an input signal with a permitted second common mode voltage range smaller than the first common mode voltage range,
    wherein the output of the pre-amplification has a smaller common mode voltage variation than the permitted second common mode voltage range; and
    wherein the main amplifying stage comprises two branches between a supply current source and ground, the supply current source connected to the high voltage rail, each branch comprising, in series, a main amplifying stage input transistor connected to the supply current source and a resistor connected to ground.

14. A method as claimed in claim 13, wherein the differential pre-amplification generates a differential current output and comprises a differential current to differential voltage conversion.

* * * * *